United States Patent [19]
Yu et al.

[11] Patent Number: 5,365,190
[45] Date of Patent: Nov. 15, 1994

[54] FEED-FORWARD DIGITAL PHASE AND AMPLITUDE CORRECTION SYSTEM

[75] Inventors: David U. L. Yu; Patrick H. Conway, both of Rancho Palos Verdes, Calif.

[73] Assignee: Duly Research, Inc., Rancho Palos Verdes, Calif.

[21] Appl. No.: 55,314

[22] Filed: May 3, 1993

[51] Int. Cl.⁵ .............................................. H03L 7/00
[52] U.S. Cl. ................................ 330/149; 330/207 P; 330/298; 330/145; 330/129
[58] Field of Search ............ 330/294, 149, 284, 207 P, 330/298, 145, 129, 151

[56] References Cited

U.S. PATENT DOCUMENTS

| | | | |
|---|---|---|---|
| 4,600,892 | 7/1986 | Wagner et al. | 330/149 |
| 4,803,440 | 2/1989 | Hotta et al. | 330/145 |
| 5,182,524 | 1/1993 | Hopkins | 330/279 |

OTHER PUBLICATIONS

Adaptive Feed Forward in the Lanl RF Control System, C. D. Ziomek, 1992 Linear Accelerator Proceedings, Aug. 24–28, 1992, pp. 683–685.

Feed Forward RF Control System of the Accelerator Test Facility, I. Ben-Zui, et al., IEEE Particle Accelerator Conference, May 6–9, 1991, San Francisco, Calif., pp. 1323–1325.

Phase and Amplitude Stabilization of Short-Pulsed, High Power Microwave Amplifiers, D. Hopkins et al., IEEE Particle Accelerator Conference, May 6–9, 1991, San Francisco, Calif., pp. 1335–1337.

Primary Examiner—William L. Sikes
Assistant Examiner—Fetsum Abraham
Attorney, Agent, or Firm—Irving Keschner

[57] ABSTRACT

Phase and amplitude modifications in repeatable RF pulses at the output of a high power pulsed microwave amplifier are made utilizing a digital feed-forward correction system. A controlled amount of the output power is coupled to a correction system for processing of phase and amplitude information. The correction system comprises circuitry to compare the detected phase and amplitude with the desired phase and amplitude, respectively, and a digitally programmable phase shifter and attenuator and digital logic circuitry to control the phase shifter and attenuator. The Phase and amplitude of subsequent are modified by output signals from the correction system.

7 Claims, 5 Drawing Sheets

FEED-FORWARD DIGITAL PHASE AND AMPLITUDE CORRECTION SYSTEM

This invention was made with Government support under Small Business Innovation Research (SBIR) Grant No. DE-FG03-90ER80907 awarded by the Department of Energy. The Government has certain rights in the invention.

BACKGROUND OF THE INVENTION

1. Field of the Invention

The present invention relates to high power pulsed microwave amplifiers and, in particular, to a correction system utilizing a digitally programmable phase shifter and attenuator and associated control circuitry to minimize unwanted phase and amplitude variations in the output pulses generated by the pulsed microwave amplifier.

2. Description of the Prior Art

Devices for producing repeatable pulses of microwave energy at very high peak power levels typically include a pulsed microwave amplifier which amplifies a signal produced by a low power microwave generator. The energy required for signal amplification may be derived from a high energy electron beam that is directed into the amplifier. Klystrons, relativistic klystrons, free electron lasers and cyclotron auto-resonant masers are examples of pulsed microwave amplifiers of this kind.

Amplitude and phase stability at the output of pulsed microwave amplifiers of this kind is strongly dependent on the stability of the driving electron beam. Variations in electron beam energy can cause the phase of the microwave output energy to vary during the course of a pulse. Variations in beam current may produce amplitude fluctuations in the high power microwave output during an output pulse.

The variations are tolerable in some applications that require a very high power source of microwave energy such as in nuclear fusion plasma heating installations. Greater stability is needed in other usages of such apparatus as in certain types of charged particle accelerators.

Recently developed pulsed microwave amplifiers typically operate with pulse durations as short as a few tens of nanoseconds. Conventional feedback correction techniques cannot be used to stabilize the phase and/or amplitude of the output of high power pulsed microwave sources during each pulse in instances where the duration of each pulse is less than about 100 nanoseconds. These devices frequently have physical sizes and resulting long signal paths that make it impractical, if not impossible, to correct phase and amplitude variations within a pulse using conventional feedback techniques and systems.

A prior art system that seeks to provide a solution to the above problem provides a method for stabilizing the output of an electron beam driven pulsed microwave amplifier of the type having an input for receiving a low power microwave signal that is to be amplified and an output for delivering periodic output pulses of amplified microwave energy to a load. The phase and amplitude characteristics of the microwave energy that is to be stabilized is sensed at several time points of the output pulses of the high power amplifier to produce a sequence of output signals. The output signals are compared with predetermined reference signals to produce a sequence of error signals that are indicative of variations of the characteristics at the amplifier output during individual ones of the output pulses. The error signals obtained during each of the sequence of output pulses are used to produce and store correction signals. The correction signals which were stored during prior output pulses are used to modify the low power microwave input signal during subsequent output pulses to suppress the variations during the subsequent output pulses. This method, in essence, utilizes a feed-forward correction technique.

The apparatus includes means for comparing the output signals with the reference signals to produce a sequence of error signals that are indicative of variations of both the amplitude and phase characteristics at the amplifier output during individual ones of the output pulses. Additional means store correction signals that include the error signals during each amplifier output pulse and use the correction signals that were stored during prior output pulses to modify the characteristics in the low power microwave input signal during subsequent output pulses to suppress the variations in the subsequent output pulses. In this prior art system, a voltage controlled phase shifter is coupled into the low power microwave signal path. A phase difference detector has a first input coupled to the reference signal and a second input coupled to the amplifier output. The output of the phase difference detector exhibit a voltage difference that is a function of the magnitude of phase error at the amplifier output. A phase correction signal storage means is coupled to the phase difference detector and has means for storing a plurality of momentary values during the course of each pulsed amplifier output pulse. The momentary values are indicative of the value of the voltage difference at successive different times in the course of the output pulse combined with the momentary value that was stored at the corresponding time during a preceding output pulse. Further components include means for sequentially reading out the previously stored momentary values during each output pulse in the form of a series of voltage levels which jointly provide the control voltage for the voltage controlled variable phase shifter. The system also provides apparatus for suppressing amplitude variations at the output of the pulsed microwave amplifier during individual output pulses. A voltage controlled amplitude modulator, such as an attenuator or other device displaying a voltage controlled amplitude characteristic, is coupled into the input signal path. An amplitude difference detector has a first input coupled to the reference signal and a second input coupled to the output of the amplifier and has an output which exhibits a voltage difference that is a function of the magnitude of amplitude error at the amplifier output relative to the input signal. An amplitude correction signal storage means is coupled to the amplitude difference detector and has means for storing a plurality of momentary values during the course of each amplifier output pulse. The momentary values are indicative of the value of the voltage difference at successive different times in the course of the output pulse combined with the momentary value that was stored at the corresponding time during a preceding pulse. Means are provided to sequentially read out the previously stored momentary values during each output pulse in the form of a series of successive voltage levels which jointly provide the control voltage for a voltage controlled variable signal amplitude modulator.

Although this prior art feed-forward correction system purports to provide advantages over conventional feedback correction systems, it has a number of drawbacks. In particular, the system uses analog type components, such as the voltage controlled phase shifter and amplitude modulator described hereinabove which substantially reduces the response time of the correction system. Analog output switches or multiplexers are also very slow. These analog circuit characteristics reduce the effectiveness of correcting the variations in the narrow pulse, high frequency amplifier output.

What is thus desired is to provide a method and apparatus to correct unwanted variations in the phase and amplitude of a radio frequency (RF) pulse generated by a beam driven high power RF source in a manner which is faster and more accurate and reliable than previously proposed correction systems.

SUMMARY OF THE PRESENT INVENTION

The present invention provides a correction system for generating repeatable RF pulses of programmable (or constant) phase and amplitude at the output of a high power amplifier, the system comprising a digitally programmable phase shifter and attenuator and logic and RF circuitry required to control them.

Phase and amplitude correction (modulation) of narrow duration output pulses (typically about 100 nanoseconds width) is applied to arrive at the high power amplifier at the appropriate time to correct the output pulse. A small amount of the high-level output power is coupled to the corrector system for processing of phase and amplitude information. This information comprises error and correction data. The input and output data is processed at very high speed. If the RF pulses are generated at moderate repetition rate, the processing of the error and correction data can be done at a much slower clock rate between pulses.

An external pulse is applied to start the correction cycle for each pulse. This pulse is timed so that its leading edge causes the phase and amplitude corrections to arrive at the high-power amplifier at the correct time.

The occurrence of the high power output pulse is detected with an amplitude detector. The leading edge of this pulse is used to start storing the phase and amplitude information of this pulse. This information is used to correct the next pulse.

Fast clock pulses are generated in bursts of M pulses at the bin rate. Each burst, for the phase shifter, the attenuator and the output pulse is synchronized with its associated timing pulse, the synchronous timing pulse being synchronized with a clock to initiate the fast clock burst.

Phase and amplitude error decisions are made regarding the high level output pulse, the phase detector using the CW input as a reference. It is adjusted to operate at zero degrees or at a fixed offset nominally with the adjustable delay (or phase shifter) in the CW path. The amplitude is detected with a non-phase sensitive detector. The phase detector output is digitized by a comparator which produces low or high logic levels depending on whether the error is positive or negative. The amplitude pulse is applied to two comparators, the reference voltage of one being adjusted for the desired peak level of the output and the other at a different (preferably lower) level to act as a pulse detector to produce the output timing pulse.

The input pulses are detected in a similar manner with respect to appropriate reference levels to produce timing pulses.

The phase and amplitude errors are converted from analog to digital form (1-bit A/D conversion) and stored in shift registers during the output pulse for processing between pulses. A comparator (a 1-bit A/D converter) is used in the phase and also in the amplitude channel to determine the sign of the error about a manually set reference. This permits generation of an RF output pulse of constant phase and amplitude.

The A/D converter or comparator outputs are stored in serial-in/serial-out (SI-SO) shift registers on a bin-by-bin basis. The phase and amplitude correction data is also stored in shift registers.

The shift registers storing the error data shift-in fast and shift-out slowly. The correction data registers shift-in slow and shift-out fast.

A specific improvement of the present invention is to provide very fast bin-to-bin switching in the phase shifter and the attenuator which modify the RF input pulse. An attenuator using RF mixers provides a digital-to-analog converter (DAC) working directly at RF. An RF DAC is used to implement a programmable attenuator and a programmable phase shifter. The mixers are digitally controlled as bi-phase modulators producing binary weighted outputs which are summed (combined) to produce the desired output amplitude. The phase shifter uses such an attenuator to produce a quadrature (90 degrees) voltage of zero to some maximum amplitude of +90 or −90 degrees which is vector summed (combined) with a fixed-amplitude RF voltage.

The present invention thus provides an improved feed-forward phase and amplitude correction system to control a high power pulsed microwave amplifier which produces very narrow output pulses, the correction system utilizing digital circuitry to enhance corrector processing times.

DESCRIPTION OF THE DRAWING

For a better understanding of the invention as well as other objects and further features thereof, reference is made to the following description which is to be read in conjunction with the accompanying drawing wherein.

DESCRIPTION OF THE INVENTION

Figure 1:
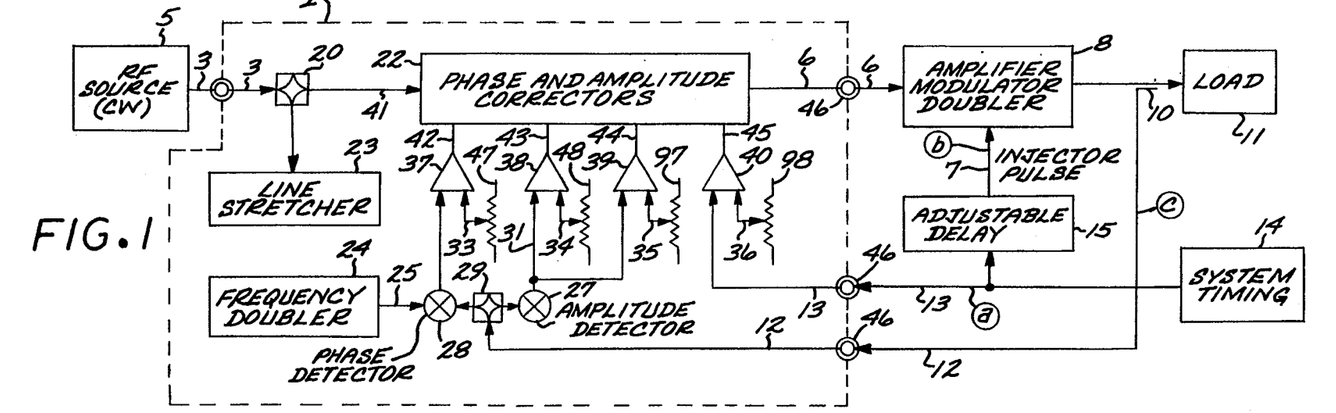
FIG. 1 is a block diagram of the feed-forward digital phase and amplitude correction system of the present invention with a radio frequency continuous wave input.
Figure 2:
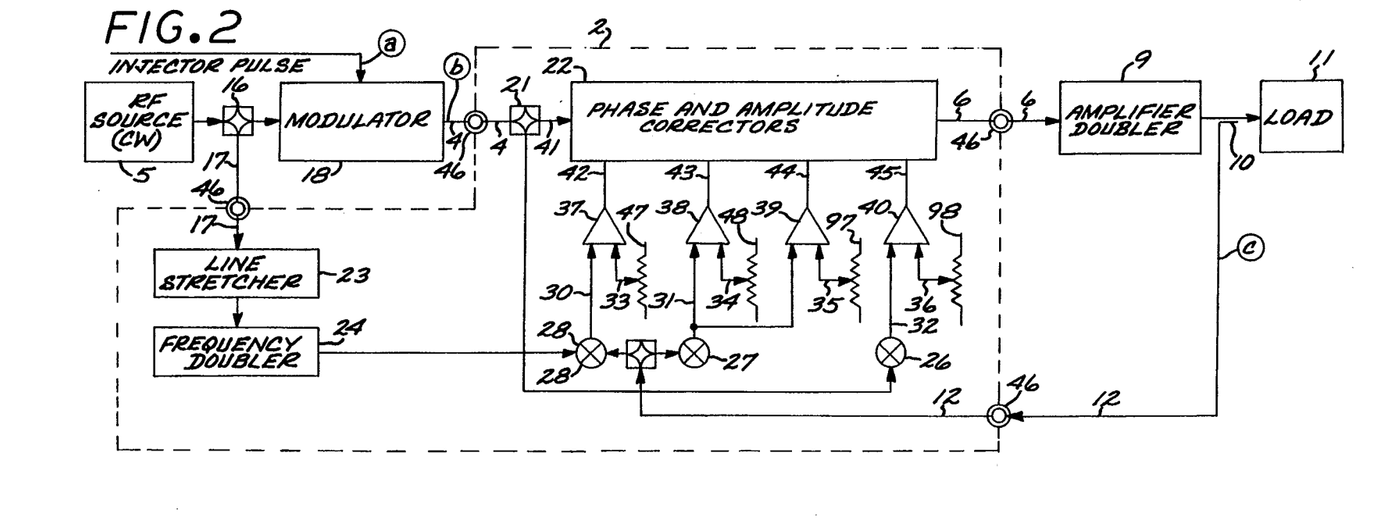
FIG. 2 is a block diagram of the feed-forward digital phase and amplitude correction system of the present invention with a radio frequency pulse input.

Referring to FIGS. 1 and 2, block diagrams of phase and amplitude correction systems 1 and 2, respectively, in accordance with the teachings of the present invention are illustrated. Input signals on leads 3, 12 and 13 of FIG. 1 or 4, 12 and 17 of FIG. 2 and output signals on lead 6 are connected to the circuitry illustrated with coaxial or waveguide connectors 46. FIG. 1 shows system operation with a radio frequency (RF) continuous wave (CW) source 5 applied to the input lead 3 and FIG. 2 shows an RF pulse on input lead 4. In FIG. 1, the RF CW output 6 is amplified and converted to a pulse by high power pulse amplifier 8 which results in an integer multiplication of the RF frequency (doubled in the application illustrated). The RF pulse (typically of very high power) is then applied to a load 11. A small amount of the RF output pulse power is applied to the system i input lead 12 via directional coupler 10. Likewise, in FIG. 2, the RF pulse output 6 is amplified and has its frequency multiplied by high power pulse amplifier 9. The RF output pulse is then applied to load 11 with a small amount of RF power applied to the system 2 input lead 12 via directional coupler 10. The RF signal may traverse a considerable distance (several to many meters) from the time it leaves the output 6 till it arrives back at input 12.

In FIG. 1, an output timing pulse 13' (FIG. 3, trace a) is provided by the system timing 14 via lead 13 to synchronize the phase and amplitude correction timing. The adjustable delay 15 provides a delayed pulse 7' (FIG. 3, trace b) which is adjusted so that the corrected RF signal arrives at the amplifier 8 coincident with the delayed injector pulse 7'.

In FIG. 2, the output of a RF source 5 is split by power splitter 16 and applied to the system 2 input via lead 17 and the pulse modulator 18, which in conjunction with the injector pulse 19' (FIG. 4, trace a) on lead 19 produces the RF input pulse 4' (FIG. 4, trace b) on lead 4. The RF input pulse is applied to the phase and amplitude corrector 22 and to amplitude detector 26 via power splitter 21. The amplitude detector output pulse is used to synchronize the application of the corrections, in lieu of pulse 13' in FIG. 3, as the pulse passes through the system.

Figure 3:
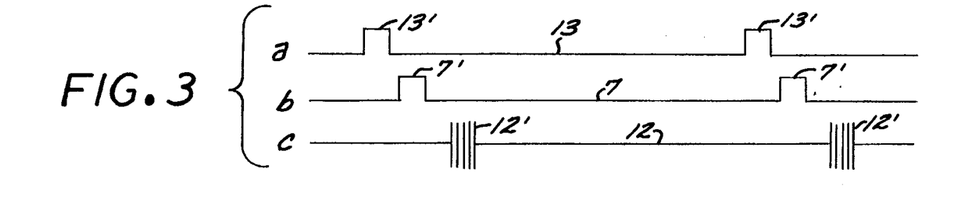
FIG. 3 shows the timing waveforms for the block diagram shown in FIG. 1.

Referring to the timing waveforms shown in FIG. 3, waveform a initiates a correction cycle, waveform b occurs in coincidence with the corrected RF waveform at the amplifier 8 and RF waveform c arrives at system input 12 time delayed from the output 6.

Figure 4:
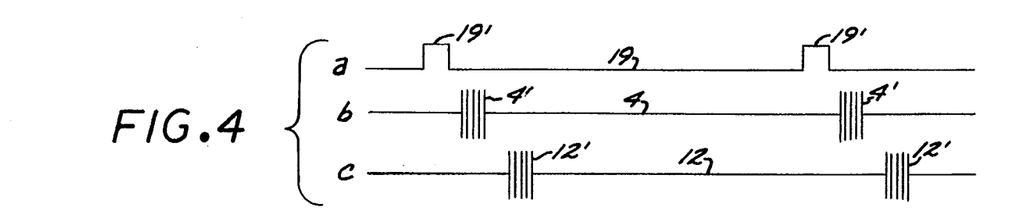
FIG. 4 shows the timing waveforms for the block diagram shown in FIG. 2.

Referring to the timing waveforms are shown in FIG. 4, waveform a initiates the RF pulse of waveform b which in turn initiates the correction cycle. The RF pulse of waveform c arrives at system input 12 with some delay after leaving output 6 as described with reference to FIG. 1.

In FIG. 1, the input on lead 3 is applied to phase and amplitude correctors 22 (subsequently referred to as the corrector) and line stretcher 23 via splitter 20. In FIG. 2, input pulse 4 is applied to corrector 22 and amplitude detector 26 via splitter 21.

The system output pulse which is applied to system input 12 is applied to phase detector 28 and amplitude detector 27 via splitter 29. The reference phase on lead 25 for the phase detector 28 is derived from the input on lead 3 (FIG. 1) or on lead 17 (FIG. 2) via line stretcher 23 and frequency multiplier (doubler) 24. The multiplication factor of multiplier 24 if equal to that of amplifiers 8 or 9, and may be equal to one (i.e., no multiplication). The line stretcher 23 is adjusted to produce a signal of zero degrees phase or some arbitrary average value on the output lead 30 of phase detector 28.

Analog signals on leads 30, 31 and 32 are converted to logic levels by comparators 37, 38, 39 and 40. Reference voltages or thresholds for the comparators are individually adjustable at inputs 33, 34, 35 and 36 with potentiometers 47, 48, 97 and 98, respectively. The comparators may be considered to be 1-bit analog-to-digital (A/D) converters although A/D converters of several bits could also be used.

Comparator 37 produces the phase error signal at its output 42; comparator 38 produces the amplitude error signal at its output 43; and comparator 39 produces the input timing synchronization pulse at its output 44, the amplitude error threshold 34 being independent of the input timing threshold 35. Comparator 40 produces the output timing synchronization pulse at its output 45. The input to comparator 40 in FIG. 1 is a pulse 13 provided by the system timing 14. The input to comparator 40 in FIG. 2 is derived from the RF pulse input 4 via the output on lead 32 from amplitude detector 26.

Figure 5:
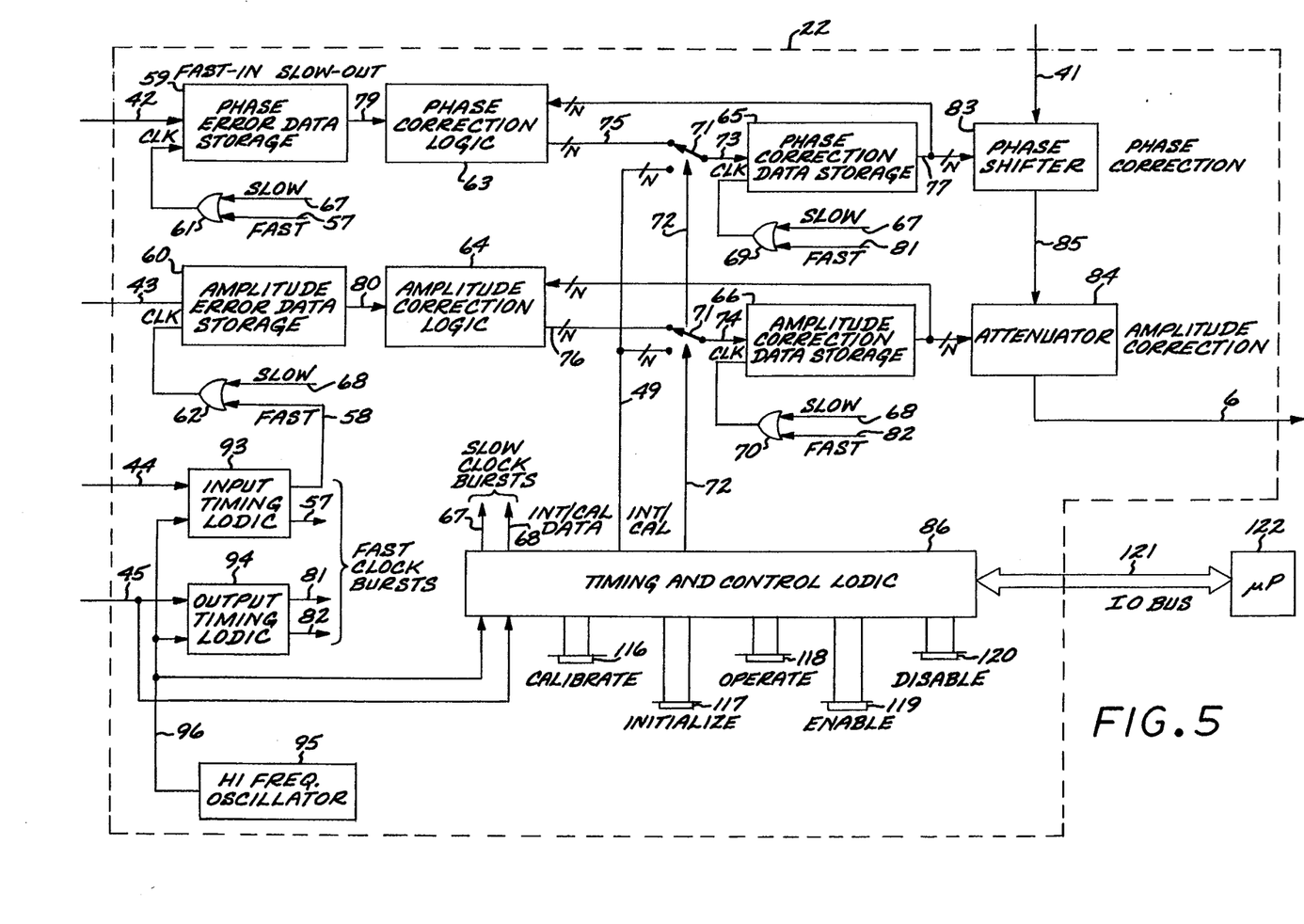
FIG. 5 is a block diagram of the phase and amplitude correctors shown in FIGS. 1 and 2.

The block diagram for corrector 22 is shown in FIG. 5. Each pulse is divided into many time bins (10 to 100), M being designated as the number of bins. The bin rate is equal to M divided by the pulse width. There are as many words of error and correction data as there are bins. The error data on leads 79 and 80 comprise 1-bit words, although several bits could be implemented. The correction data on leads 77 or 78 is illustrated as N-bit words, where N may be as low as approximately 4 to as high as approximately 10.

Figure 6:
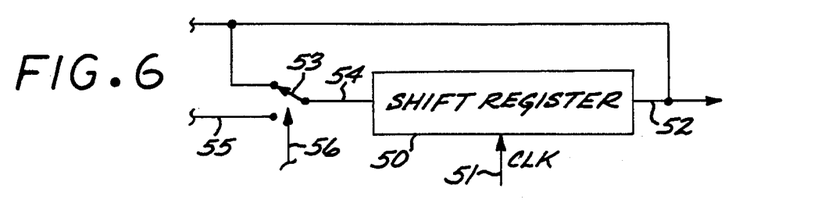
FIG. 6 is an operational block diagram of a shift register used for data storage in the circuit shown in FIG. 5.

Shift registers can be utilized for error and correction data storage, although other devices such as random-access memory (RAM) or analog devices such as surface acoustic wave (SAW) devices could be used. A shift register which can be utilized is illustrated schematically in FIG. 6 as register 50 and comprises M-bits. A timing signal on lead 51 comprises M bursts of pulses which are applied to write or read the M words of a pulse. In the case of the correction data on leads 77 or 78, it is necessary to save the data after a correction cycle in order to process the error data on leads 79 and 80 to generate the correction data for the next cycle. This is achieved by end-around shifting. During the correction cycle, the output on lead 52 from register 50 is applied to the shift register input 54 via multiplexer 53 which is controlled by select input 56. During the processing cycle, the new data on lead 55 is applied to the input 54 via multiplexer 53. N shift registers (one per bit of data) are required for each storage bank.

During an output pulse on lead 12 (FIGS. 1 and 2), fast clock bursts on leads 57 and 58 (400 MHz to 1 GHz) of M pulses are applied to storage banks 59 and 60, respectively, via OR-gates 61 and 62 storing the error data appearing at inputs 42 and 43, respectively. This data need not be saved after it is read-out so end-around shifting is not implemented.

The error data is processed between pulses to generate correction data for the next pulse. The algorithm for the mechanization (phase correction logic 63 and amplitude correction logic 64) illustrated is to add or subtract one to each corresponding word of the correction data according to the sign of the corresponding error. Limiting is incorporated such that the result of adding 1 to an all 1's word is all 1's or subtracting 0 from an all 0's word results in all 0's. This is implemented in straightforward adder logic and is not described in detail herein. More sophisticated algorithms could be implemented if error words of several bits were available.

During the processing cycle the data on leads 79 and 80 of storage banks 59 and 60, respectively, and 77 and 78 of storage banks 65 and 66, respectively, is read out by applying slow clock bursts on leads 67 and 68 (approximately 1 MHz) of M pulses via OR-gates 61 and 62 and 69 and 70, respectively, and processed by the correction logic 63 and 64, the results on leads 75 and 76 being stored in storage banks 65 and 66 via multiplexer 71 and inputs 73 and 74, respectively. Multiplexer 71 is held in the correct position by select input 72. Only one correction logic block 63 or 64 is needed if time-shared for a phase data processing cycle followed by an amplitude processing cycle (or vice versa). This would require additional multiplexing circuitry.

During the correction cycle, the correction data on leads 77 and 78 is shifted out of storage banks 65 and 66, respectively, by applying the fast clock bursts 81 and 82 via OR-gates 69 and 70 and applied to the phase shifter 83 and the attenuator 84, respectively. The RF input on lead 41 (either CW or pulse) has its phase corrected by phase shifter 83 and is then coupled to the attenuator 84 via lead 85 wherein the amplitude is corrected. The order of the phase and amplitude correction could be reversed. The output on lead 6 is then passed to the system signal processing device 8 or 9 of FIG. 1 or 2.

Figure 7:
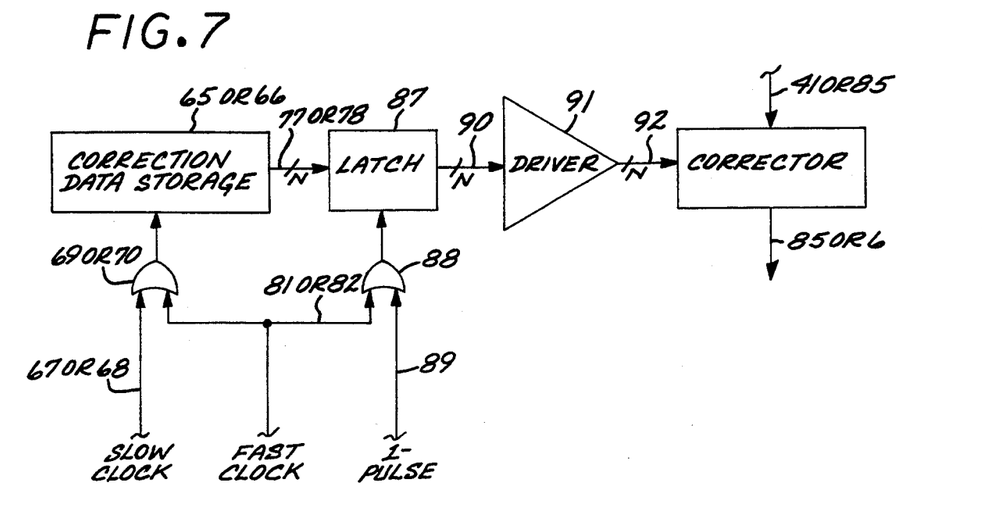
FIG. 7 illustrates in more detail the interface between the correction data storage and phase and amplitude corrector and timing components shown in FIG. 5.

The interface between the storage banks 65 and 66 and the correctors 83 and 84 is shown in more detail in FIG. 7. As the data on leads 77 or 78 is shifted out by clock 81 or 82 via OR-gate 69 or 70, it is clocked into de-skewing latch 87 by clock 81 or 82 via OR-gate 88. The N-bit latch 87 outputs on lead 90 are converted to appropriate analog voltage and current levels by the N drivers 91 and applied to the corrector 83 or 84 input 92. The RF input 41 or 85 is appropriately corrected and appears as an output 85 or 6. In order that the first bin data appears at the corrector 83 or 84 prior to the next pulse, the storage bank 65 or 66 output on leads 77 or 78 is latched by a single clock pulse 89 via OR-gate 88 which occurs at the end of the processing cycle.

Figure 8:
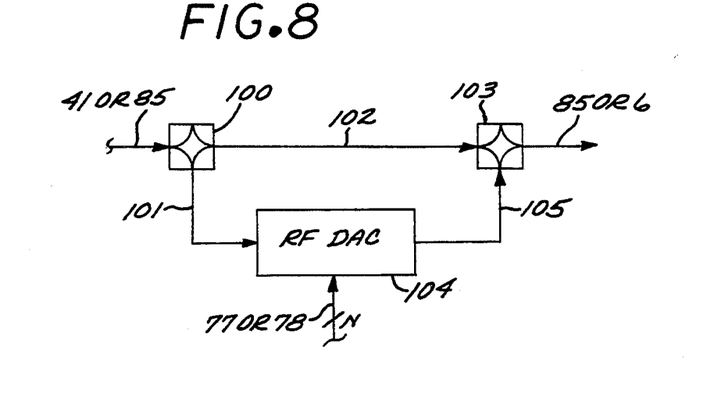
FIG. 8 shows the implementation of the phase or amplitude corrector comprising an RF DAC.

A preferred implementation of the phase shifter and attenuator correctors 83 and 84 is shown in FIG. 8 and is described in more detail in co-pending application Ser. No. 07/952,065, filed Sept. 28, 1992, the teachings of which are necessary for an understanding of the present invention being incorporated herein by reference. The RF input 41 or 85 is split by power splitter 100 and applied to the input 101 of radio-frequency digital-to-analog converter (RF DAC) 104 and to power combiner 103 via lead 102. The output of the RF DAC 104 is also applied to combiner 103 via lead 105.

The RF DAC 104 produces an RF output 105 according to the state of the digital input 77 or 78, as shown in the following table:

| Digital Input | Output Voltage | Output Phase |
|---|---|---|
| 0000 0000 or 1111 1111 | Maximum | 0 or 180 degrees |
| 0111 1111 or 1000 0000 | Very small | 0 or 180 degrees |
| 1000 0000 or 0111 1111 | Very small | 180 or 0 degrees |
| 1111 1111 or 0000 0000 | Maximum | 180 or 0 degrees |

The output voltage 85 or 6 of the combiner 103 is equal to 0.7071 times the vector sum of its inputs 102 and 105 (not accounting for insertion losses). Thus the output 85 or 6 varies in amplitude according to the state of the input 77 or 78. The range of attenuation can be adjusted by changing the amount of attenuation in the output path of RF DAC 104.

The circuit of FIG. 8 results in a phase shifter rather than an attenuator if a 90 degree combiner is used for combiner 103, which produces a 90 degree phase shift in one of its inputs. The range of phase shift can be adjusted by changing the amount of attenuation in the output path of RF DAC 104.

Figure 9:
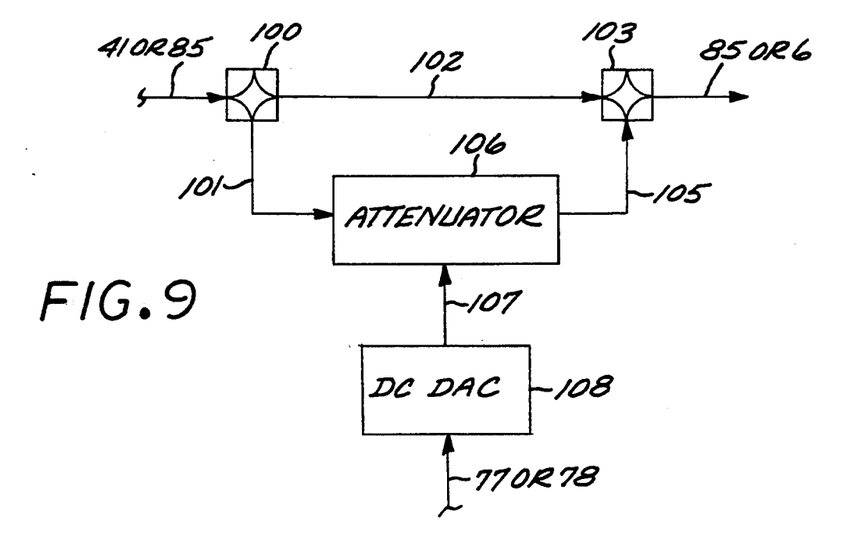
FIG. 9 shows another implementation of the phase or amplitude corrector comprising a variable attenuator.

An optional implementation for the correctors from that of FIG. 8 is shown in FIG. 9. Operation is identical to that of FIG. 8 except that RF DAC 104 is replaced by attenuator 106 and DC DAC 108.

A DC DAC is a conventional DAC with a Direct Current (DC) coupled output. An attenuator such as a Hewlett-Packard HMMC-1001 could be used. The digital input 77 or 78 is converted to an analog (voltage or current) signal on lead 107 by DAC 108 which controls the attenuator 106.

Figure 10:
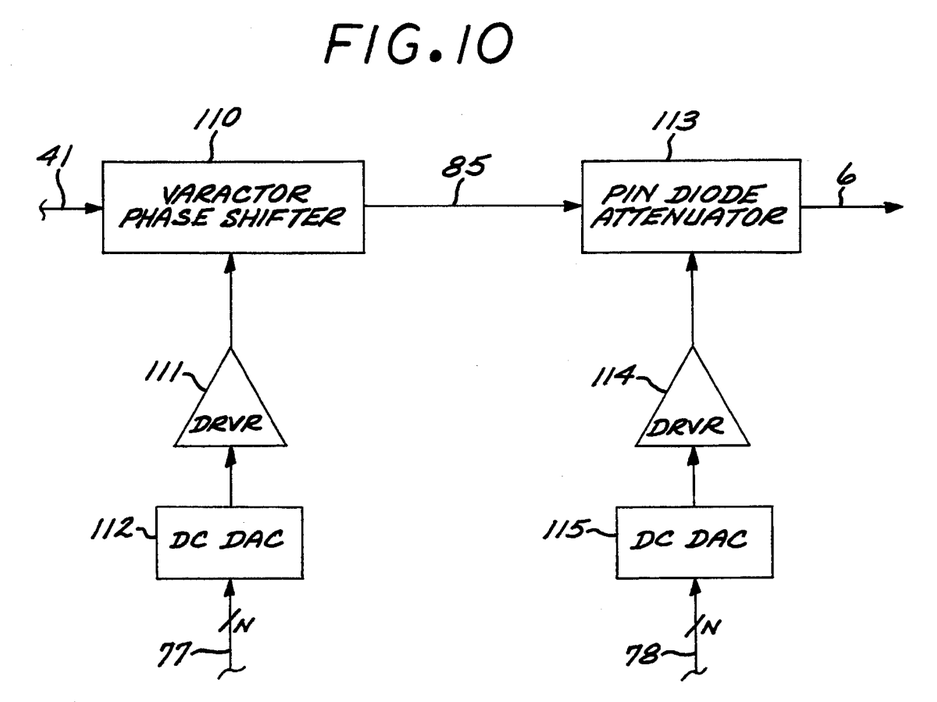
FIG. 10 is an alternate implementation of the phase and amplitude correctors shown in FIG. 5.

Another possible implementation for the phase and amplitude correctors is shown in FIG. 10. In the phase corrector the RF input on lead 41 is phase-shifted with varactor diodes 110. The digital input on lead 77 is converted to an analog signal by DC DAC 112 which is properly conditioned by driver 111 to control the varactor circuitry 110. The output amplitude on lead 85 is corrected by a pin diode attenuator 113. The digital input on lead 78 is converted to an analog signal by DC DAC 114 which is properly conditioned by driver 114 to control the attenuator 113.

The output signal 6 is thus corrected in both phase and amplitude (the order of phase and amplitude correction can be reversed).

Figure 11:
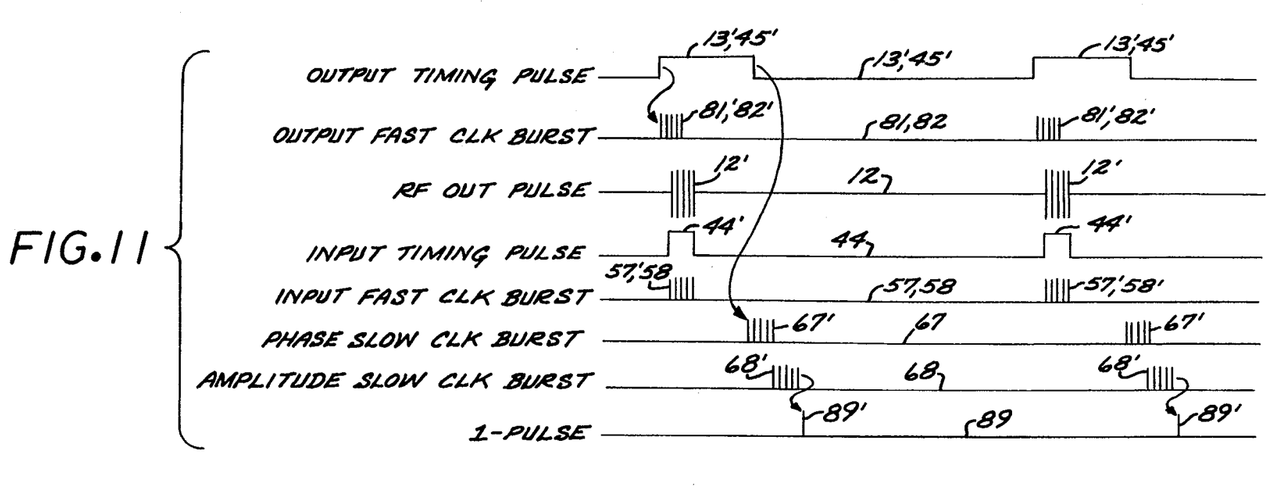
FIG. 11 shows the timing waveforms for the block diagram shown in FIG. 5.

The fundamental timing of the correction system 1 of FIG. 1 is shown in FIG. 11, based on time-sharing of the phase and amplitude correction logic 63 and 64. Operation for system 2 of FIG. 2 is similar. The correction input timing corresponds to the RF output pulse delivered to the load 11, since it is during this interval that the error data is accumulated. The correction system output timing corresponds to the time that the associated RF pulse is in the corrector 22 since the phase and amplitude corrections are applied during this interval. Note that the output pulse 45' on lead 45 occurs before the input pulse 44' on lead 44.

The cycle is started by the output timing pulse 45'. The correction cycle or fast clock bursts 81' and 82' on lead 81 and 82, respectively, are initiated by the leading edge of pulse 45' on lead 45 and the processing cycle or slow clock bursts 67' and 68' on leads 67 and 68, respectively, by the trailing edge. Pulse a of FIG. 3 is triggered by the leading edge of the output timing pulse 13' (or 45') of FIG. 11. The pulse 45' on lead 45 is approximately 2 microseconds in duration to allow for completion of the correction cycle before starting the data processing cycle. In the case of FIG. 2, it may be necessary to stretch pulse 45' since it is derived directly from the RF pulse on lead 4 and may not allow adequate time between the correction and processing cycles. The burst on lead 82 will be delayed somewhat from burst on lead 81 to compensate for the delay in the phase corrector 83 (FIG. 5). The RF output pulse appears at the corrector system input 12 some time after the bursts on leads 81 and 82. The input timing pulse 44' on lead 44 occurs when the RF output pulse on lead 12 is detected by amplitude detector 27 and comparator 39, triggering the input fast clock bursts on leads 57 and 58. The timing between bursts on leads 57 and 58 can be skewed to compensate for timing differences in the phase and amplitude error detection paths.

The slow clock bursts on leads 67 and 68 of M pulses of the data processing cycle are initiated after the completion of the correction cycle. If correction logic block 63 or 64 is replaced by one which is time-shared, one burst of pulses on lead 67 or 68 will occur after the burst on lead 67 as illustrated.

After the completion of the processing cycle, the correction data for the first bin of the next cycle appears at the output of the storage banks 65 and 66 and the data for the last bin of the previous cycle resides in the latch 87 (see FIG. 7). A pulse 89' on lead 89 from the timing and control logic 86 is then applied to the latch 87 via OR-gate 88 to latch the data of the first bin of the next pulse. Thus the correctors are anticipating the correction for the beginning of the next pulse. This does not affect the state of the storage banks 65 and 66 and the data for the first bin will again be transferred to the latch 87 by the first pulse of the next burst of pulses on leads 81 or 82.

The input timing logic 93 and output timing logic 94 are identical in generating the fast clock bursts on leads 57 and 58 and on leads 81 and 82 of M pulses but operate independently in time, being triggered by the input timing pulse on leads 44 and the output timing pulse on lead 45, respectively. They are driven by the high frequency clock on lead 96 which is generated by the oscillator 95. The clock on lead 96 could also be generated by dividing-down the RF CW input 3 of FIG. 1 or 17 of FIG. 2. The frequency of clock on lead 96 is some integer multiple of the bin rate, in the range of approximately 4 to 10 times.

The bin-rate clocks on leads 57 and 58 and leads 81 and 82 are derived by dividing-down the frequency of the clock on lead 96. Since the clock bursts are started on any cycle of the clock on lead 96, the granularity (granularity is the reciprocal of resolution) of synchronizing the bin clocks with the actual bins (starting at the leading edge of the trigger pulses 44' and 45') is a fraction of a bin-time. For example, if the frequency of the clock on lead 96 is 8 times the bin-rate, the granularity is 1/8 of a bin period.

Referring to FIG. 5, the system 22 is controlled by the timing and control logic 86. Each correction and processing cycle is initiated by the output timing pulse 50 on lead 45. Essential timing and control functions are derived from the high-speed clock on lead 96 which produces the phase corrector slow clock 67', the amplitude corrector slow clock 68' the 1-pulse output on lead 89, the initiation and calibration data on lead 49 and the initiate/calibrate control signal on lead 72.

The CALIBRATE function of timing and control logic 86 is needed only in the configuration of FIG. 1. The calibrate pushbutton 116 is pushed to enter this mode. Since the input 3 is CW information, the arrival of the corrected RF signal 6 with the injector pulse 7' must be synchronized. This is achieved by modulating the RF output 6 with a square wave and observing the RF output pulse 12 as it arrives back at the system 1. Delay 15 is then adjusted until proper synchronization is realized.

The INITIALIZE function is used to load the correction data storage banks 65 and 66 with predetermined data. The correction loops may converge slowly since a correction of only +/−1 may be made each cycle. Thus, it is desirable to initialize the system at power-on with data which is close to the expected operating levels. This power-on mode is entered by pushing the OPERATE pushbutton 118 (pushbutton 118 could be eliminated by going into OPERATE automatically after one INITIALIZE cycle).

Correction operation may be ENABLED or DISABLED by pushing the appropriate pushbutton 119 or 120. When disabled, the correction data is repeated each cycle without further corrections. Phase and amplitude corrections may be ENABLED or DISABLED independently.

It should be noted that a microprocessor (illustrated by reference numeral 122 in FIG. 5) could be provided for operation and control of the system via input/output (I/O) bus 121 with appropriate software and eliminate a number of components shown in FIG. 5, including the manually operated pushbuttons 116, 117 . . . 120, comparator threshold potentiometers 47, 48, 97 and 98 and correction logic hardware 63 and 64.

While the invention has been described with reference to its preferred embodiment, it will be understood by those skilled in the art that various changes may be made and equivalents may be substituted for elements thereof without departing from the true spirit and scope of the invention. In addition, modifications may be made to adapt a particular situation or material to the teachings of the invention without departing from its essential teachings.

What is claimed is:

1. A correction system for stabilizing the phase and amplitude of output pulses generated by a device such that repeatable, RF pulses are generated, said device having an input for receiving a first signal that is to be amplified and an output for delivering periodic RF output pulses of amplified energy to a load comprising:

first means for detecting the phase of said first signal and producing a reference signal that is indicative of said phase, second means for detecting the phase in said amplifier output pulses and producing digital output signals that are indicative of said phase in said amplifier output pulses; and first means for comparing each of said output signals with said reference signal to produce a sequence of error signals that are indicative of variations of said phase at said pulsed amplifier output during individual ones of said amplifier output pulses, said comparing means comprising a phase detector and said error signals are indicative of phase variations from reference levels at said output of said device, said reference levels being constant or controlled by a digital microprocessor, and means for modifying said phase in said first signal comprising a phase shifter controlled by digital signal processing devices comprising phase error data storage means, timing means, phase correction logic means and phase correction data storage means, said error signals being stored during each of said sequence of said amplifier output pulses, the error signals which were stored during prior amplifier output pulses modifying said phase in said first signal during subsequent output pulses to provide repeatable subsequent output pulses.

2. The correction system of claim 1 further including second means for comparing the amplitude of a reference signal and said output signals and wherein said error signals are indicative of amplitude variations from said reference signal at said output of said device, said reference signal being constant or variably controlled by a digital microprocessor, and wherein said means for modifying the amplitude in said first signal includes an attenuator controlled by digital processing devices comprising amplitude error data storage means, timing means, amplitude correction logic means and amplitude correction data storage means, said amplitude modifying means suppressing said amplitude variations by making compensating adjustments in said first signal.

3. The correction system of claim 2 wherein said phase error data storage means has first and second inputs and an output, the output of said phase comparator being connected to said first input of said phase error data storage means, a timing signal being applied to said second input thereof, said phase correction logic means having first and second inputs and an output, the output of said phase error data storage means being connected to said first input of said phase correction logic means, said phase correction data storage means having first and second inputs and an output, the output of said phase correction logic means being coupled to said first input of said phase correction data storage means, said output of said phase correction data logic means being connected to said input of said phase correction logic means and to said phase shifter, a digital timing signal being applied to the second input of said phase correction data storage means.

4. The correction system of claim 3 further including means for controlling whether said output of said phase correction logic means is coupled to said first input of said phase correction data storage means.

5. The correction system of claim 4 wherein said amplitude error data storage means has first and second inputs and an output, the output of said amplitude comparator being connected to said first input of said amplitude error data storage means, a timing signal being applied to said second input thereof, said amplitude correction logic means having first and second inputs and an output, the output of said amplitude error data storage means being connected to said first input of said amplitude correction logic means, said amplitude correction data storage means having first and second inputs and an output, the output of said amplitude correction logic means being coupled to said first input of said amplitude correction data storage means, said output of said amplitude correction data storage means being connected to said second input of said amplitude correction logic means and to a first input of said attenuator, a digital timing signal being applied to the second input of said amplitude correction data storage means.

6. The correction system of claim 5 further including means for controlling whether said output of said amplitude correction logic means is coupled to said first input of said amplitude correction data storage means.

7. The correction system of claim 6 wherein the output of said phase shifter is connected to a second input of said attenuator.

* * * * *